United States Patent [19]
Takahashi et al.

[11] Patent Number: 5,715,084
[45] Date of Patent: Feb. 3, 1998

[54] REFLECTION AND REFRACTION OPTICAL SYSTEM AND PROJECTION EXPOSURE APPARATUS USING THE SAME

[75] Inventors: Kazuhiro Takahashi, Utsunomiya; Masato Muraki, Inagi, both of Japan

[73] Assignee: Canon Kabushiki Kaisha, Tokyo, Japan

[21] Appl. No.: 464,067

[22] Filed: Jun. 5, 1995

Related U.S. Application Data

[62] Division of Ser. No. 164,539, Dec. 10, 1993.

[30] Foreign Application Priority Data

Dec. 14, 1992 [JP] Japan .................... 4-333105

[51] Int. Cl.$^6$ .................... G02B 5/30; G02B 27/28; G03B 27/70
[52] U.S. Cl. .................... 359/487; 359/495; 359/497; 359/900; 355/45; 355/60; 355/66; 355/77
[58] Field of Search .................... 359/487, 494, 495, 496, 497, 727, 728, 371, 900; 355/45, 55, 66, 60, 67, 77

[56] References Cited

U.S. PATENT DOCUMENTS

| | | |
|---|---|---|
| 3,508,809 | 4/1970 | Wilder et al. |
| 3,620,593 | 11/1971 | Tackaberry ............... 359/371 |
| 3,658,405 | 4/1972 | Pluta ............... 359/371 |
| 3,677,621 | 7/1972 | Smith. |
| 3,698,808 | 10/1972 | Delmas. |
| 3,704,061 | 11/1972 | Travis. |
| 3,767,290 | 10/1973 | Lang et al. |
| 3,917,399 | 11/1975 | Buzawa et al. |
| 4,521,082 | 6/1985 | Suzuki et al. |
| 4,682,311 | 7/1987 | Matsubayashi et al. ............... 359/495 |
| 4,963,003 | 10/1990 | Hiiro. |
| 4,974,919 | 12/1990 | Muraki et al. |
| 5,073,830 | 12/1991 | Loucks ............... 359/495 |
| 5,153,773 | 10/1992 | Muraki et al. |
| 5,212,593 | 5/1993 | Williamson et al. |
| 5,220,454 | 6/1993 | Ichihara et al. |
| 5,289,312 | 2/1994 | Hashimoto et al. |
| 5,387,991 | 2/1995 | Mitsutake et al. ............... 359/487 |

FOREIGN PATENT DOCUMENTS

| | | |
|---|---|---|
| 1572195 | 3/1970 | Germany. |
| 4110296 | 10/1991 | Germany. |
| 60-151610 | 8/1985 | Japan. |
| 1321303 | 6/1973 | United Kingdom. |

OTHER PUBLICATIONS

Matsumoto, Koichi, et al., "Issues and Method of Designing Lenses for Optical Lithography," Optical Engineering, 31(12); pp. 2657-2664 (Dec. 1992).

*Primary Examiner*—Ricky D. Shafer
*Attorney, Agent, or Firm*—Fitzpatrick, Cella, Harper & Scinto

[57] ABSTRACT

A reflection and refraction optical system includes a polarization beam splitter, a concave mirror, a lens group and a quarter waveplate, wherein an additional waveplate is provided to transform S-polarized light from the polarization beam splitter into circularly polarized light.

13 Claims, 3 Drawing Sheets

5,715,084

REFLECTION AND REFRACTION OPTICAL SYSTEM AND PROJECTION EXPOSURE APPARATUS USING THE SAME

This application is a division of application Ser. No. 08/164,539 filed Dec. 10, 1993.

FIELD OF THE INVENTION AND RELATED ART

This invention relates generally to an imaging optical system such as a reflection and refraction optical system and, more particularly, to a reflection and refraction optical system usable for imaging a fine pattern in the manufacture of microdevices such as semiconductor devices (such as ICs or LSIs), image pickup devices (such as CCDs) or display devices (such as liquid crystal panels). According to another aspect, the invention is concerned with a projection exposure apparatus using such a reflection and refraction optical system.

The degree of integration of a semiconductor device such as IC or LSI is increasing, and fine processing technology for a semiconductor wafer is being improved considerably. In the projection exposure technique which is the main portion of fine processing technology, the resolution has been increased to a level allowing formation of an image of a linewidth not greater than 0.5 micron.

The resolution can be improved by shortening the wavelength of light used for the exposure process. However, the shortening of the wavelength restricts the glass materials usable for a projection lens system, and correction of chromatic aberration becomes difficult to attain.

A projection optical system with which the difficulty of correcting chromatic aberration can be reduced, may be a reflection and refraction optical system comprising a concave mirror and a lens group, wherein the imaging function is mainly attributed to the power of the concave mirror.

Such reflection and refraction optical system may include a polarization beam splitter, a quarter waveplate and a concave mirror, disposed in this order from the object plane side. Light from the object plane may pass through the polarization beam splitter and the quarter waveplate, it may be reflected by the concave mirror. After this, the light may pass through the quarter waveplate and the polarization beam splitter, and it may be imaged upon an image plane. The combination of a polarization beam splitter and a quarter waveplate may be effective to reduce the loss of light. However, the use of rectilinearly polarized light for the imaging process may involve a problem in the formation of a fine image of a linewidth not greater than 0.5 micron because the imaging performance may change in dependence upon the orientation (lengthwise direction) of a (linear) pattern on the object plane.

As an example, the contrast of an image of 0.2 micron, which can be formed by using a projection optical system of a numerical aperture (N.A.) of 0.5 and a design wavelength 248 nm together with a phase shift mask (line-and-space pattern), is changeable by about 20%, depending on whether the direction of polarization of light used for the imaging process is parallel to or perpendicular to the lengthwise direction of the pattern.

SUMMARY OF THE INVENTION

It is an object of the present invention to provide an improved imaging optical system effective to solve the problem described above.

It is another object of the present invention to provide an improved reflection and refraction optical system effective to solve the problem described above.

It is a further object of the present invention to provide an improved projection exposure apparatus which is free from the problem described above.

An imaging optical system according to the present invention may include a polarization beam splitter, a quarter waveplate and a reflection mirror which may be disposed in this order from an object plane. Light from the object plane may pass through the polarization beam splitter and the quarter waveplate, and it may be reflected by the reflection mirror. The reflected light may pass through the quarter waveplate and the polarization beam splitter, and then it may be imaged upon an image plane. Means may be provided between the polarization beam splitter and the image plane, for changing the plane of polarization of polarized light from the polarization beam splitter.

A reflection and refraction optical system according to the present invention may include a polarization beam splitter, a quarter waveplate and a concave reflection mirror which may be disposed in this order from an object plane. Light from the object plane may pass through the polarization beam splitter and the quarter waveplate, and it may be reflected by the concave reflection mirror. The reflected light pass through again the quarter waveplate and the polarization beam splitter, and then it may be imaged upon an image plane. Means may be provided between the polarization beam splitter and the image plane, for changing the plane of polarization of polarized light from the polarization beam splitter.

A projection exposure apparatus according to the present invention may include projection optical system for projecting a pattern of a mask onto a substrate to be exposed. The projection optical system may comprises a polarization beam splitter, a quarter waveplate and a concave reflection mirror which may be disposed in this order from the mask. Light from the mask may pass through the polarization beam splitter and the quarter waveplate, and it may be reflected by the concave reflection mirror. The reflected light may again pass through the quarter waveplate and the polarization beam splitter, and then it may be directed to the substrate such that the pattern of the mask may be imaged upon the substrate. Means may be provided between the polarization beam splitter and the image plane, for changing the plane of polarization of polarized light from the polarization beam splitter.

A reflection and refraction optical system or a projection exposure apparatus according to the present invention may suitably used for the manufacture of microdevices such as semiconductor devices (such as ICs or LSIs), image pickup devices (such as CCDs) or display devices (such as liquid crystal panels). Particularly, a reflection optical system of the present invention when arranged to provide a reduction magnification and used as a projection optical system in combination with deep ultraviolet light, may be effective to image a fine device pattern of a linewidth not greater than 0.5 micron.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
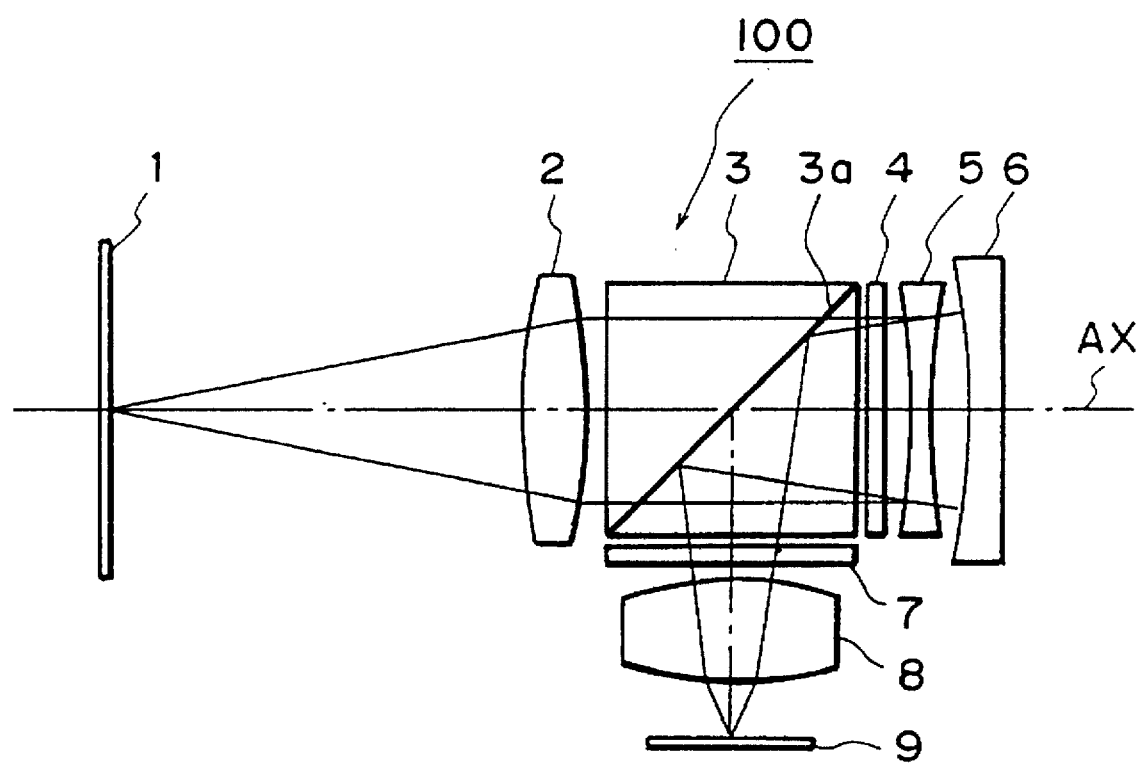
FIG. 1 is a schematic view of a reduction projection exposure apparatus for the manufacture of semiconductor devices, according to an embodiment of the present invention.

FIG. 1 illustrates a reduction projection exposure apparatus according to an embodiment of the present invention, for the manufacture of semiconductor devices.

Denoted in FIG. 1 at 1 is a reticle having a circuit pattern to be transferred to a wafer 9 for the manufacture of semiconductor devices. The reticle 1 is held on an object plane of a reflection and refraction optical system 100, by means of a reticle stage (not shown). The circuit pattern of the reticle 1 can be illuminated with deep ultraviolet light of a wavelength $\lambda(<300$ (nm)) from an illumination system (not shown), with uniform illuminance. Divergent light from the illuminated reticle 1, including zeroth order and first order diffraction light, is received by a first lens group 2 having a positive refracting power. The first lens group 2 serves to transform the received divergent light into a parallel light consisting of a flux of light rays parallel to the optical axis AX, and it projects the light on a polarization beam splitter 3. The parallel light incident on the polarization beam splitter 3 passes through the same, and then it passes through a quarter waveplate 4 and enters a second lens group 5 having a negative refracting power.

The parallel light passing through the polarization beam splitter 3 and impinging on the lens group 5 is P-polarized light with respect to the dividing plane 3a of the polarization beam splitter 3. Of the parallel light impinging on the polarization beam splitter 3, the light which is S-polarized light with respect to the dividing plane 3a is reflected by that plane 3a upwardly as viewed in the drawing.

Further, the quarter waveplate 4 is arranged and disposed so as to transform P-polarized light, entering it from the left hand side in the drawing, into circularly polarized light and also to transform circularly polarized light, entering it from the right hand side in the drawing, into S-polarized light.

The second lens group serves to transform the parallel light, passing through the polarization beam splitter 3 and the quarter waveplate 4, into divergent light and to project the same on a concave mirror 6. The concave mirror 6 has a spherical reflection surface which is rotationally symmetrical with respect to the optical axis AX. The concave mirror 6 serves to reflect and converge the received divergent light back to the lens group 5. The light passes through the second lens group 5 and the quarter waveplate 4, and it is projected to the polarization beam splitter 3. Due to the function of the quarter waveplate 4, the light reflected and converged by the concave mirror 6 and impinging again on the polarization beam splitter 3 is S-polarized light with respect to the dividing plane 3a. As a consequence, this re-entering light is reflected by the dividing plane 3a of the polarization beam splitter 3 downwardly as viewed in the drawing.

Disposed below the polarization beam splitter 3 are a polarization plane changing means 7 and a third lens group 8 having a positive refracting power. Further below the third lens group 3, there is a silicon wafer 9 used in the manufacture of semiconductor devices, which wafer is held by a movable X-Y stage (not shown) so that its surface, to be exposed, coincides with the image plane of the reflection and refraction optical system 100.

The polarization plane changing means 7 comprises a quarter waveplate which serves to transform the light, reflected by the dividing plane 3a of the polarization beam splitter 3, into circularly polarized light which in turn is projected on the third lens group 8. The third lens group 8 serves to collect the circularly polarized light from the quarter waveplate of the polarization plane changing means 7, and a reduced image of the circuit pattern of the reticle I is formed on the wafer 9.

The projection exposure apparatus of this embodiment uses a polarization beam splitter (3), but it is arranged to form an image from circularly polarized light. As a consequence, for imaging fine patterns, there does not occur non-uniformness of resolution between different patterns which might otherwise result from the polarization dependency of the pattern. In other words, the projection exposure apparatus of this embodiment assures constant resolution independently of the type (orientation) of the fine pattern of a reticle 1 used.

In the projection exposure apparatus of this embodiment, the reticle stage for supporting the reticle I may be disposed horizontally and a reflection mirror may be provided between the reticle stage and the lens group 2 so as to deflect the optical axis AX by 45 deg. In that case, the overall size of the apparatus can be made small.

The projection exposure apparatus of this embodiment may be arranged to execute step-and-repeat exposures according to which the X-Y stage on which the wafer 9 is placed is moved stepwise to form circuit patterns on substantially the whole surface of the wafer 9. Alternatively, it may be arranged to execute step-and-scan exposures wherein the X-Y stage on which the wafer 9 is placed is moved stepwise and so as to permit scanning.

The projection exposure apparatus of this embodiment may be used in combination with a phase shift mask as the reticle 1. In that case, it may be possible to image a pattern of a smaller linewidth. Further, the structure of the illumination system (not shown) may be modified into an oblique illumination system by which the reticle 1 is illuminated along a direction inclined with respect to the optical axis AX. Also in that case, a pattern of smaller linewidth may be imaged.

The projection exposure apparatus of this embodiment may use a light source comprising a KrF excimer laser ($\lambda \approx 248$ nm), an ArF excimer laser ($\lambda \approx 193$ nm) or an ultra high pressure Hg lamp (emission line spectrum: $\lambda \approx 250$ nm), for example.

In another embodiment according to the present invention, a projection exposure apparatus such as described above may include a polarization plane changing means 7 comprising a half waveplate being made rotatable about the optical axis AX. When such polarization plane changing means is used, it is possible to change the plane of polarization of light from the polarization beam splitter 3 in accordance with the orientation of a fine pattern of a reticle 1 used. Thus, imaging with polarization light of increased resolution (non-deteriorated resolution) may always be assured.

For example, in the case where a fine pattern of a reticle 1 has a lengthwise direction laid longitudinally (up and down) as viewed in the drawing, the rotational angle of the half waveplate 7 may be so set as to transform the plane of polarization of the light from the polarization beam splitter 3, from S-polarized light into P-polarized light.

In the case where a fine pattern of a reticle 1 has a lengthwise direction laid perpendicularly to the sheet of the drawing, the rotational angle of the half waveplate 7 may be set so as to retain the plane of polarization (S-polarization) of the light from the polarization beam splitter 3.

In the case where a fine pattern of a reticle 1 has an orientation, extending both longitudinally as viewed in the drawing and perpendicular to the sheet of the drawing, (i.e., a cross pattern), the rotational angle of the half waveplate 7 may be so set as to transform the plane of polarization (S-polarization) of the light from the polarization beam splitter 3, into polarized light of 45 deg. with respect to both of the S-polarization and P-polarization.

In a further embodiment according to the present invention, the waveplate of the polarization plane changing means 7 may comprise an electro-optic crystal device (EO optical-modulator) whose birefringence (double refraction) characteristic can be controlled electrically.

Next, an embodiment of a method of manufacturing semiconductor devices based on the reticle 1 and the projection exposure apparatus of FIG. 1, will be explained.

Figure 2:
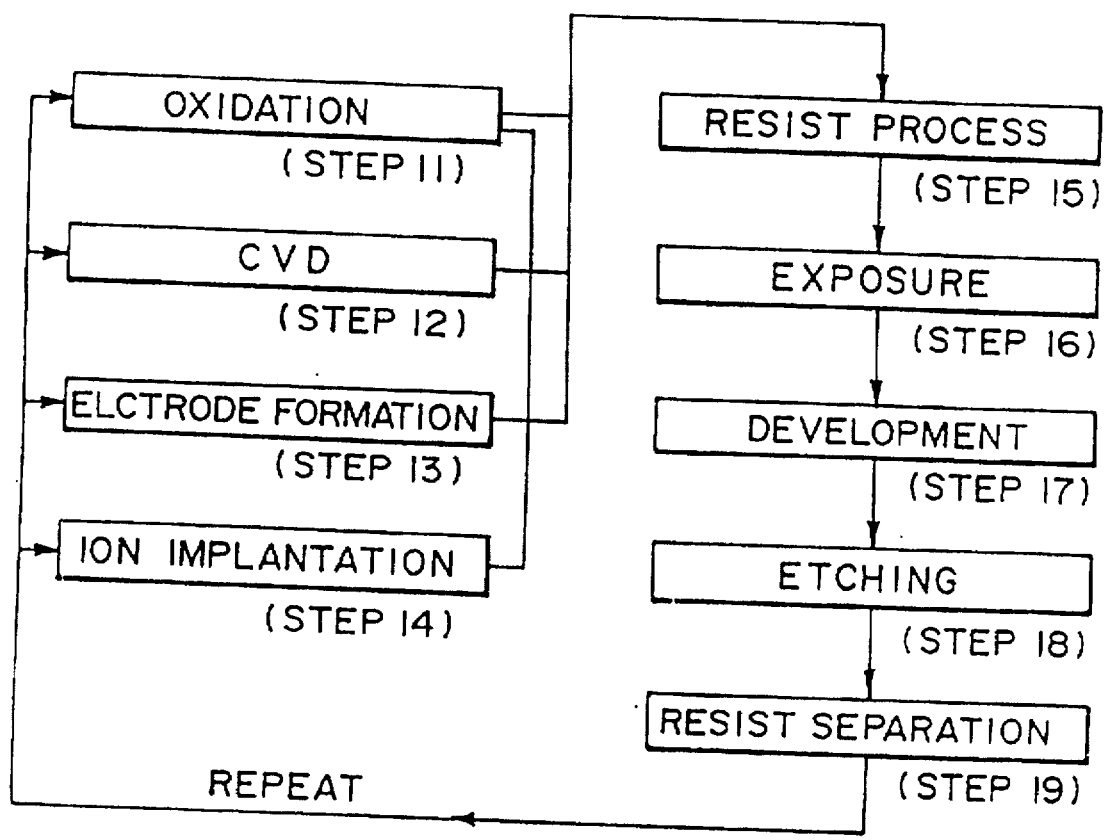
FIG. 2 is a flow chart of semiconductor device manufacturing processes.

FIG. 2 is a flow chart of the sequence of manufacturing a semiconductor device such as a semiconductor chip (e.g. IC or LSI), a liquid crystal panel, or a CCD, for example. Step 1 is a design process for designing the circuit of a semiconductor device. Step 2 is a process for manufacturing a mask on the basis of the circuit pattern design. Step 3 is a process for manufacturing a wafer by using a material such as silicon.

Step 4 is a wafer process which is called a pre-process wherein, by using the so prepared mask and wafer, circuits are practically formed on the wafer through lithography. Step 5 subsequent to this is an assembling step which is called a post-process wherein the wafer processed by step 4 is formed into semiconductor chips. This step includes assembling (dicing and bonding) and packaging (chip sealing). Step 6.is an inspection step wherein an operability check, a durability check, and so on, of the semiconductor devices produced by step 5 are carried out. With these processes, semiconductor devices are finished and they are shipped (step 7).

Figure 3:
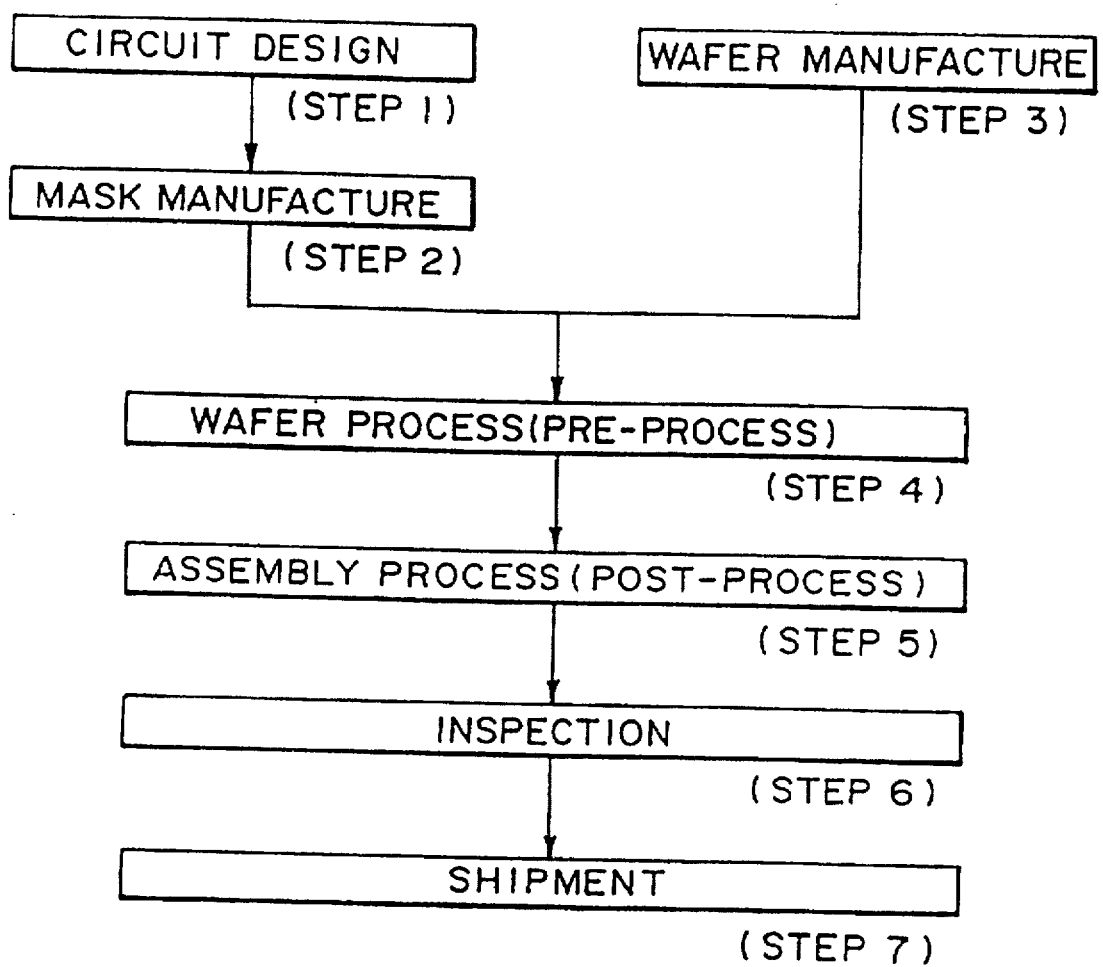
FIG. 3 is a flow chart, illustrating details of a wafer process.

FIG. 3 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes on the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

As described hereinbefore, the present invention according to an aspect thereof provides an imaging optical system or a reflection and refraction optical system, by which high resolution is assured independently of the type (orientation) of a fine pattern of an object to be projected. Thus, the present invention according to another aspect effectively assures an improved projection exposure apparatus having superior projection exposure performance and based on a reflection and refraction optical system, or a method of manufacturing various devices through the use of a reflection and refraction optical system.

While the invention has been described with reference to the structures disclosed herein, it is not confined to the details set forth and this application is intended to cover such modifications or changes as may come within the purposes of the improvements or the scope of the following claims.

What is claimed is:

1. An imaging optical system, comprising:

a polarization beam splitter;

a quarter waveplate;

a reflection mirror; and polarization plane changing means;

wherein a beam from an object plane is projected by way of said polarization beam splitter and said quarter waveplate upon said reflection mirror, wherein the projected beam is reflected by said reflection mirror and is projected by way of said quarter waveplate and said polarization beam splitter upon an image plane, and wherein said polarization plane changing means is disposed between said polarization beam splitter and the image plane to change the plane of polarization of the beam from said beam splitter, wherein said polarization plane changing means comprises a half waveplate effective to transform a beam from said polarization beam splitter into a rectilinearly polarized beam, being polarized in a desired direction.

2. An imaging optical system, comprising:

a polarization beam splitter;

a quarter waveplate;

a concave mirror; and a half waveplate:

wherein a beam from an object plane is projected by way of said polarization beam splitter and said quarter waveplate upon said concave mirror, wherein the projected beam is reflected by said concave mirror and is projected by way of said quarter waveplate and said polarization beam splitter upon an image plane, and wherein said half waveplate is disposed between said polarization beam splitter and the image plane to change the beam from said beam splitter to a linearly polarized beam, being polarized in a desired direction.

3. An imaging optical system according to claim 2, further comprising a first lens group disposed between the object plane and said polarization beam splitter and a third lens group disposed between said polarization beam splitter and the image plane.

4. An imaging optical system according to claim 3, wherein said first lens group is effective to transform a beam from the object plane into a parallel beam and to project the parallel beam to said polarization beam splitter.

5. An imaging optical system according to claim 4, further comprising a second lens group disposed between said polarization beam splitter and said concave mirror, wherein said second lens group is effective to transform the parallel beam from said polarization beam splitter into a divergent beam and to direct the same to said concave mirror.

6. An imaging optical system according to claim 3, wherein said half waveplate is disposed between said polarization beam splitter and said third lens group.

7. A projection exposure apparatus for projecting a pattern of mask onto a substrate, comprising:

a polarization beam splitter;

a quarter waveplate;

a reflection mirror; and polarization plane changing means;

wherein a beam from the mask is projected by way of said polarization beam splitter and said quarter waveplate upon said reflection mirror, wherein the projected beam is reflected by said reflection mirror and is projected by way of said quarter waveplate and said polarization beam splitter upon the substrate, and wherein said polarization plane changing means is disposed between said polarization beam splitter and the substrate to change the plane of polarization of the beam from said beam splitter, wherein said polarization plane changing means comprises a half waveplate effective to transform a beam from said polarization beam splitter into a rectilinearly polarized beam, being polarized in a desired direction.

8. A projection exposure apparatus for projecting a pattern of mask onto a substrate, comprising:

a polarization beam splitter;

a quarter waveplate;

a concave mirror; and a half waveplate;

wherein a beam from the mask is projected by way of said polarization beam splitter and said quarter waveplate upon said concave mirror, wherein the projected beam is reflected by said concave mirror and is projected by way of said quarter waveplate and said polarization beam splitter upon the substrate, and wherein said half waveplate is disposed between said polarization beam splitter and the substrate to change the beam from said beam splitter to a linearly polarized beam, being polarized in a desired direction.

9. An apparatus according to claim 8, further comprising a first lens group disposed between the mask and said polarization beam splitter and a third lens group disposed between said polarization beam splitter and the substrate.

10. An apparatus according to claim 9, wherein said first lens group is effective to transform a beam from the mask into a parallel beam and to project the parallel beam to said polarization beam splitter.

11. An apparatus according to claim 10, further comprising a second lens group disposed between said polarization beam splitter and said concave mirror, wherein said second lens group is effective to transform the parallel beam from said polarization beam splitter into a divergent beam and to direct the same to said concave mirror.

12. An apparatus according to claim 9, wherein said half waveplate is disposed between said polarization beam splitter and said third lens group.

13. A device manufacturing method for manufacturing micro devices using a projection exposure apparatus which projects a pattern of a mask onto a substrate, comprising a polarization beam splitter, a quarter waveplate, a concave mirror, and a half waveplate disposed between the polarization beam splitter and the substrate, wherein said method comprises the step of projecting a device pattern of the mask onto the substrate to transfer the device pattern of the mask to the substrate by:

projecting a beam from the mask by way of the polarization beam splitter and the quarter waveplate upon the concave mirror;

reflecting the projected beam from the concave mirror via the quarter waveplate and the polarization beam splitter toward the substrate; and changing the projected beam reflected from the concave mirror toward the substrate to a linearly polarized beam polarized in a desired direction by the half waveplate.

* * * * *

UNITED STATES PATENT AND TRADEMARK OFFICE
CERTIFICATE OF CORRECTION

PATENT NO.   :   5,715,084

DATED        :   February 3, 1998

INVENTOR(S)  :   Kazuhiro TAKAHASHI, et al.

It is certified that error appears in the above-identified patent and that said Letters Patent is hereby corrected as shown below:

COLUMN 2:

Line 25, "pass" should read --may pass--.
Line 31, "include" should read --include a--.
Line 33, "comprises" should read --comprise--.
Line 48, "used" should read --be used--.

COLUMN 4:

Line 5, "reticle I" should read --reticle 1--.
Line 18, "reticle I" should read --reticle 1--.

COLUMN 5:

Line 31, "6.is" should read --6 is--.

COLUMN 6:

Line 29, "waveplate:" should read --waveplate;--.
Line 60, "mask" should read --a mask--.

UNITED STATES PATENT AND TRADEMARK OFFICE
CERTIFICATE OF CORRECTION

PATENT NO. : 5,715,084

DATED : February 3, 1998

INVENTOR(S) : Kazuhiro TAKAHASHI, et al.

It is certified that error appears in the above-identified patent and that said Letters Patent is hereby corrected as shown below:

COLUMN 7:

Line 14, "mask" should read --a mask--.

Signed and Sealed this

Twelfth Day of January, 1999

Attest:

Attesting Officer     *Acting Commissioner of Patents and Trademarks*